United States Patent
Wang et al.

(10) Patent No.: US 11,016,624 B2
(45) Date of Patent: May 25, 2021

(54) TOUCH DISPLAY PANEL AND MANUFACTURING METHOD THEREOF, DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yangpeng Wang, Beijing (CN); Haihong Zheng, Beijing (CN); Zhenhua Zhang, Beijing (CN); Yingsong Xu, Beijing (CN); Guoqiang Ma, Beijing (CN); Yuanyuan Chai, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/665,365

(22) Filed: Oct. 28, 2019

(65) Prior Publication Data
US 2020/0272279 A1 Aug. 27, 2020

(30) Foreign Application Priority Data
Feb. 25, 2019 (CN) .......................... 201910138639.9

(51) Int. Cl.
*G06F 3/044* (2006.01)
(52) U.S. Cl.
CPC .......... *G06F 3/0445* (2019.05); *G06F 3/0446* (2019.05); *G06F 2203/04103* (2013.01)

(58) Field of Classification Search
CPC ................ G06F 3/0445; G06F 3/0446; G06F 2203/04103
(Continued)

(56) References Cited

U.S. PATENT DOCUMENTS

| 2012/0113050 A1* | 5/2012 | Wang .................... G06F 3/0412 345/174 |
| 2013/0299791 A1 | 11/2013 | Hirakata et al. |

(Continued)

FOREIGN PATENT DOCUMENTS

| CN | 107342370 A | * 11/2017 |
| CN | 107342370 A | 11/2017 |
| CN | 109121399 A | 1/2019 |

OTHER PUBLICATIONS

Ryu (Ryu, S.Y. et al. "Transparent organic light-emitting diodes using resonant tunneling double barrier structures", Applied Physics Letters, vol. 91, Issue 9 (2007), downloaded from https://doi.org/10.1063/1.2776347, on Aug. 21, 2020) (Year: 2007).*

(Continued)

*Primary Examiner* — Mark Edwards
(74) *Attorney, Agent, or Firm* — Nath, Goldberg & Meyer; Joshua B. Goldberg (57) ABSTRACT

The present disclosure provides a touch display panel and a manufacturing method thereof and a display device, the touch display panel includes a first substrate and a second substrate arranged oppositely, light emitting units are arranged on the first substrate, each light emitting unit includes a first electrode, a light emitting layer and a second electrode which are arranged in sequence along a direction away from the first substrate; a touch control layer is arranged on the second substrate and includes a first touch pattern and a second touch pattern, the second touch pattern is located on a side of the first touch pattern distal from the second substrate, auxiliary electrodes are arranged on the (Continued)

second substrate, the auxiliary electrodes are spaced apart from the second touch pattern and arranged in a same layer as the second touch pattern, the auxiliary electrodes are in electrical contact with the second electrodes.

14 Claims, 7 Drawing Sheets

(58) Field of Classification Search
USPC .......................................................... 345/174
See application file for complete search history.

(56) References Cited

U.S. PATENT DOCUMENTS

2015/0076458 A1* 3/2015 Lee .......................... H01L 51/56
257/40
2018/0129352 A1* 5/2018 Kim ...................... G06F 3/0412

OTHER PUBLICATIONS

Office Action dated Jul. 27, 2020 issued in corresponding Chinese Application No. 201910138639.9.

* cited by examiner

FIG. 3 light emitting units are formed on a first substrate, wherein each of the light emitting units comprises a first electrode, a light emitting layer and a second electrode which are sequentially arranged along the direction far away from the first substrate — S11 a touch layer and an auxiliary electrodes are formed on a second substrate, wherein the touch layer comprises a first touch pattern and a second touch pattern, and the second touch pattern is located on a side of the first touch pattern distal from the second substrate, the auxiliary electrodes and the second touch pattern are spaced apart from each other and are formed synchronously — S12 the first substrate and the second substrate are assembled to be opposite to each other, so that the auxiliary electrodes and the second electrode are coupled in parallel — S13

TOUCH DISPLAY PANEL AND MANUFACTURING METHOD THEREOF, DISPLAY DEVICE

CROSS-REFERENCE TO RELATED APPLICATIONS

The present application claims priority to Chinese patent application No. 201910138639.9 filed in the Chinese intellectual Property office on Feb. 25, 2019, the entire disclosure of which is incorporated herein by reference.

TECHNICAL FIELD

The present disclosure relates to the technical field of touch display, and particularly to a touch display panel and a manufacturing method thereof, and a display device.

BACKGROUND

For a top-emission organic light emitting display panel, a cathode of a light emitting unit is generally made very thin to ensure brightness.

SUMMARY

An embodiment of the present disclosure provides a touch display panel including a first substrate and a second substrate arranged opposite to each other, light emitting units are arranged on the first substrate, each of the light emitting units includes a first electrode, a light emitting layer and a second electrode which are arranged in sequence along a direction far away from the first substrate, a touch control layer is arranged on the second substrate and includes a first touch pattern and a second touch pattern, the second touch pattern is located on a side of the first touch pattern distal from the second substrate, auxiliary electrodes are arranged on the second substrate, the auxiliary electrodes are spaced apart from the second touch pattern and arranged in a same layer as the second touch pattern, and the auxiliary electrodes are in electrical contact with the second electrodes.

In some implementations, the first touch pattern includes a plurality of first touch unit sets, a plurality of second touch unit sets and a plurality of connecting parts, each of the first touch unit sets includes a plurality of first touch units arranged along a first direction, and each of the second touch unit sets includes a plurality of second touch units arranged along a second direction; any two adjacent first touch control units in a same first touch unit set are coupled to each other through a connecting part, and the first direction and the second direction intersect with each other; and the second touch pattern includes a plurality of bridging parts, any two adjacent second touch control units in a same second touch control unit set are coupled to each other through a bridging part, and the bridging parts are insulated and separated from the connecting parts.

In some implementations, each of the first touch units and each of the second touch units correspond to one of the auxiliary electrodes, respectively.

In some implementations, a pixel defining layer is further arranged on the first substrate, the pixel defining layer including a plurality of spacer walls, which are crisscross to define a plurality of pixel openings, first electrodes of the light emitting units correspond to the pixel openings one to one, and second electrodes of the light emitting units are formed as a whole; a protrusion is arranged on each spacer wall and is arranged between the spacer wall and the second electrode; positions of the auxiliary electrodes correspond to positions of protrusions one to one.

In some implementations, a protective layer is arranged on a surface of the second touch pattern distal from the second substrate.

In some implementations, the first electrode is a reflective electrode and the second electrode is a transparent electrode.

In some implementations, the first electrode is a metal electrode.

In some implementations, the second electrode is a composite electrode of ITO/metal/ITO.

An embodiment of the present disclosure provides a manufacturing method of a touch display panel, including: forming light emitting units on a first surface of a first substrate, each of the light emitting units includes a first electrode, a light emitting layer and a second electrode sequentially arranged in sequence in a direction away from the first surface of the first substrate; forming a touch layer and auxiliary electrodes on a first surface of a second substrate, the touch layer includes a first touch pattern and a second touch pattern, and the second touch pattern and the auxiliary electrodes are located on a side of the first touch pattern distal from the second substrate, the auxiliary electrodes are spaced apart from the second touch pattern and are formed synchronously with the second touch pattern; assembling the first substrate and the second substrate so that the first substrate and the second substrate are opposite to each other, the auxiliary electrodes are in electrical contact with the second electrodes.

In some implementations, the first touch pattern includes a plurality of first touch unit sets, a plurality of second touch unit sets and a plurality of connecting parts, each of the first touch unit sets includes a plurality of first touch units arranged along a first direction, and each of the second touch unit sets includes a plurality of second touch units arranged along a second direction; any two adjacent first touch control units in a same first touch unit set are coupled to each other through a connecting part, and the first direction and the second direction intersect with each other; and the second touch pattern includes a plurality of bridging parts, any two adjacent second touch control units in a same second touch control unit set are coupled to each other through a bridging part, and the bridging parts are insulated and separated from the connecting parts.

In some implementations, each of the first touch units and each of the second touch units correspond to one of the auxiliary electrodes, respectively.

In some implementations, the manufacturing method further including: forming a pixel defining layer on the first surface of the first substrate, the pixel defining layer the pixel defining layer including a plurality of spacer walls which are crisscross to define a plurality of pixel openings, the first electrodes of the light emitting units correspond to the pixel openings one to one, and the second electrodes of the light emitting units are formed as a whole; and forming protrusions on a surface of the pixel defining layer distal from the first substrate, the protrusions being arranged between the spacer walls and the second electrodes; and after the first substrate and the second substrate are assembled to be opposite to each other, positions of the auxiliary electrodes correspond to positions of the protrusions one to one.

In some implementations, the manufacturing method further including: before the first substrate and the second substrate are assembled to be opposite to each other, forming a protective layer on a surface of the second touch pattern distal from the second substrate.

In some implementations, the first electrode is formed as a reflective electrode and the second electrode is formed as a transparent electrode.

An embodiment of the present disclosure further provides a display device including the above touch display panel.

BRIEF DESCRIPTION OF THE DRAWINGS

The drawings are intended to provide a further understanding of the disclosure, constitute a part of this specification, and are used to explain the present disclosure together with the following specific embodiments, but are not to be construed as limiting. In the drawings.

DETAILED DESCRIPTION

Embodiments of the present disclosure will be described in detail below with reference to the accompanying drawings. It should be understood that the embodiments described herein are merely illustrative of the disclosure and are not intended to limit the disclosure.

In the related art, for a top-emission organic light emitting display panel, in order to ensure the brightness, the cathode of the light-emitting unit is usually made very thin, which causes the problems of increased cathode resistance, increased power consumption, and non-uniform display brightness. A method for solving at least one of these problems in related art is to fabricate an auxiliary electrode on the cathode, however, this increases the number of process steps.

Figure 1:
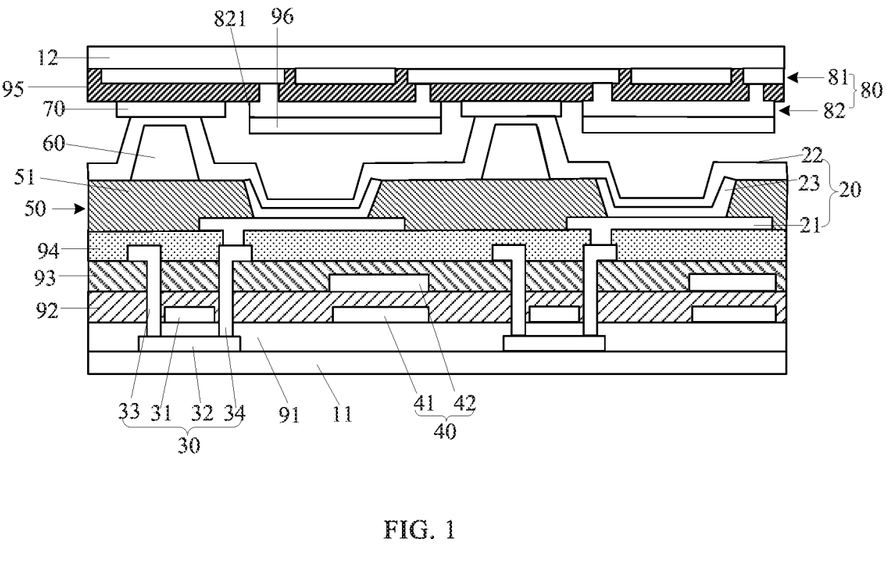
FIG. 1 is a cross-sectional view of a touch display panel according to an embodiment of the present disclosure.

In view of above, FIG. 1 shows a cross-sectional view of a touch display panel according to an embodiment of the present disclosure, and as shown in FIG. 1, the touch display panel includes a first substrate 11 and a second substrate 12 which are oppositely arranged, a light emitting unit 20 is arranged on a side of the first substrate 11 facing the first substrate 12, and the light emitting unit 20 includes a first electrode 21, a light emitting layer 23, and a second electrode 22 which are sequentially arranged along a direction away from the first substrate 11. The second substrate 12 is provided with a touch layer 80 on a side thereof facing the first substrate 11, and the touch layer 80 is used for detecting a touch position. The touch layer 80 includes a first touch pattern 81 and a second touch pattern 82, and the second touch pattern 82 is located on a side of the first touch pattern 81 distal from the second substrate 12. The second substrate 12 is further provided with auxiliary electrodes 70 arranged on a same layer as the second touch pattern 82 and spaced apart from the second touch pattern 82, and the auxiliary electrodes 70 are coupled in parallel with the second electrodes 22, i.e., the auxiliary electrodes 70 are in electrical contact with the second electrodes 22. The second electrode 22 and the auxiliary electrode 70 being coupled in parallel may jointly serve as a cathode of the light emitting unit 20, thereby reducing the resistance of the cathode of the light emitting unit 20.

It should be noted that the auxiliary electrodes 70 and the second touch pattern 82 being in a same layer means that the auxiliary electrodes 70 and the second touch 115 pattern 82 are formed by a same material layer through a patterning process, and thus the auxiliary electrodes 70 and the second touch pattern 82 are located in a same layer in the stacking relationship, but this does not mean that distances of them from the second substrate 12 must be the same.

In an implementation, the auxiliary electrodes 70 and the second touch pattern 82 of the touch layer 80 may be manufactured synchronously, so that no separate manufacturing process is required to manufacture the auxiliary electrodes 70, and thus the manufacturing process can be simplified while reducing the resistance of the cathode of the light emitting unit 20.

The touch display panel in the present embodiment is particularly suitable for a display panel in which the light emitting unit 20 is of a top emission type, and in this case, the first electrode 21 is a reflective electrode, and the second electrode 22 is a transparent electrode. The second electrode 22 may be a metal electrode with a small thickness. The first electrode 21 may be a composite electrode of ITO/metal/ITO. The number of the light emitting units 20 is plural, and the second electrodes 22 of the plural light emitting units 20 may be coupled together to be formed as a whole.

In some implementations, the auxiliary electrodes 70 may also be arranged on a surface of the second electrodes 22 distal from the first substrate 11, and are coupled to the second electrodes 22 in parallel in a direct contact manner, so as to simplify the manufacturing process.

As shown in FIG. 1, a thin film transistor 30 and a storage capacitor 40 are further arranged on the first substrate 11, and the thin film transistor 30 includes a gate electrode 31, an active layer 32, a source electrode 33, and a drain electrode 34. A first insulating layer 91 is arranged between the gate electrode 31 and the active layer 32, and the gate electrode 31 is arranged on a side of the active layer 32 distal from the first substrate 11. A first electrode plate 41 of the storage capacitor 40 is arranged in a same layer as the gate electrode 31. A side of the gate electrode 31 distal from the active layer 32 is provided with a second insulating layer 92, a second electrode plate 42 of the storage capacitor 40 is provided on a side of the second insulating layer 92 distal from the first substrate 11, and a third insulating layer 93 is arranged on the second electrode plate 42 of the storage capacitor 40. The source electrode 33 and the drain electrode 34 are coupled to the active layer 32 through via holes penetrating the first insulating layer 91 and the second insulating layer 92, respectively. A fourth insulating layer 94 is arranged on a side of the source electrode 33 and the drain electrode 34 distal from the first substrate 11. The first electrode 21 of the light emitting unit 20 is arranged on the fourth insulating layer 94 and coupled to the drain electrode 34 through a via hole penetrating the fourth insulating layer 94.

The first substrate 11 is further provided thereon with a pixel defining layer 50 including a plurality of spacer walls 51, which are crisscross to define a plurality of pixel openings. The number of the light emitting units 20 is plural, and the first electrodes 21 of the plural light emitting units 20 correspond to the plurality of pixel openings one to one. The light emitting layer 23 of each light emitting unit 20 is arranged in a corresponding pixel opening. The spacer wall 51 is provided thereon with a protrusion 60, and the protrusion 60 is provided between the spacer wall 51 and the second electrode 22. The auxiliary electrodes 70 are positioned in a one-to-one correspondence with the protrusions 60, that is, an orthographic projection of the auxiliary electrode 70 on the second substrate 12 and an orthographic projection of the protrusion 60 on the second substrate 12 at least partially overlap with each other, so that the touch layer 80 is prevented from contacting the second electrodes 22 while connections between the auxiliary electrodes 70 and the second electrodes 22 is ensured.

The light emitting unit 20 further includes other film layers (not shown) such as an electron injection layer and an electron transport layer, and the electron injection layer and the electron transport layer may be a continuous entire film layer covering the protrusions 60.

Figure 2:
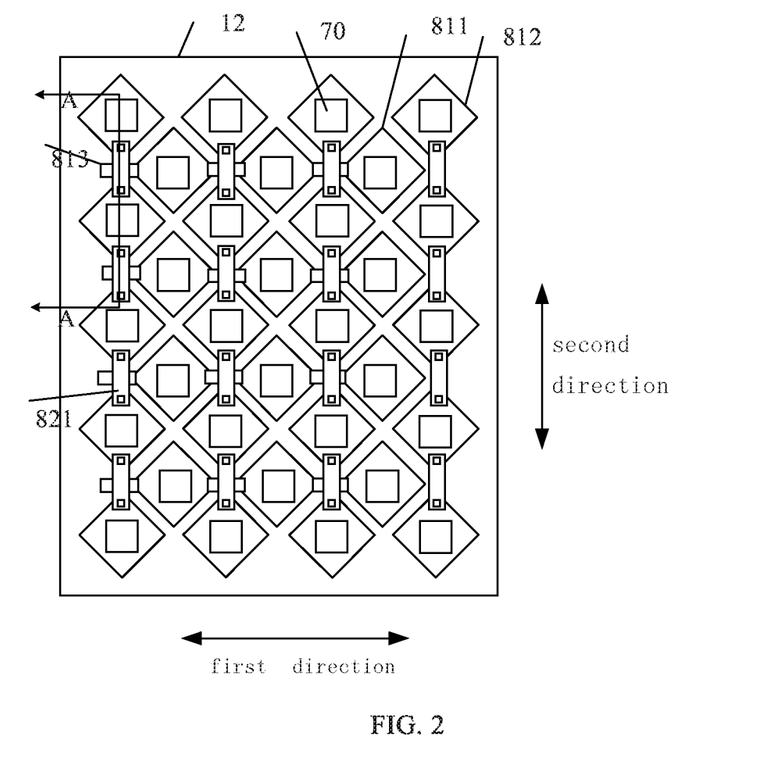
FIG. 2 is a schematic view illustrating distribution of a touch layer and auxiliary electrodes of the touch display panel shown in FIG. 1.
Figure 3:
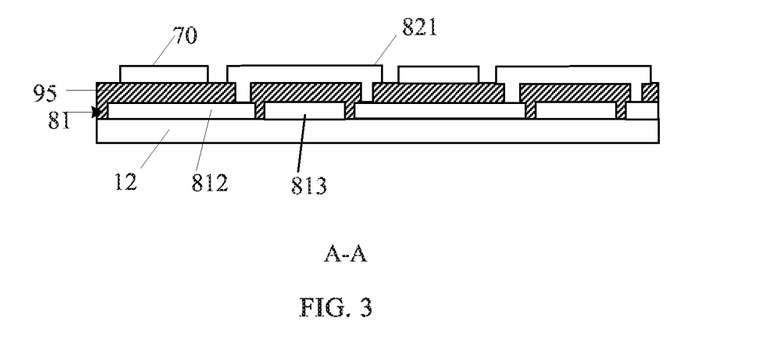
FIG. 3 is a cross-sectional view of the touch display panel of FIG. 2 taken along line AA.

FIG. 2 is a schematic view illustrating a distribution of the touch layer and the auxiliary electrodes in the touch display panel according to an embodiment of the present disclosure, and FIG. 3 is a cross-sectional view of the touch display panel of FIG. 2 taken along the line AA. As shown in FIGS. 1 to 3, the first touch pattern 81 includes a plurality of first touch unit sets, a plurality of second touch unit sets, and a plurality of connecting parts 813, each of the first touch unit sets includes a plurality of first touch units 811 arranged along a first direction, and each of the second touch unit sets includes a plurality of second touch units 812 arranged along a second direction, every two adjacent first touch units 811 in a same set are coupled to each other through a connecting portion 813. The first direction intersects with the second direction, for example, as shown in FIG. 2, the first direction is a widthwise direction of the touch display panel, and the second direction is a lengthwise direction of the touch display panel.

A touch insulating layer 95 is arranged between the first touch pattern 81 and the second touch pattern 82. The second touch pattern 82 includes a plurality of bridging parts 821, and every two adjacent second touch units 812 in a same second touch unit set are coupled to each other by a bridging part 821. The bridging parts 821 intersect with the connecting parts 813 and are insulated and separated from the connecting parts 813, and the bridging parts 821 are coupled with corresponding second touch units 812 through via holes in the touch insulating layer 95.

The first touch units 811 in a same first touch unit set are coupled together by the connecting parts 813 to form a first touch electrode, and the second touch units 812 in a same second touch unit set are coupled together by the bridging parts 821 to form a second touch electrode. One of the first touch electrode and the second touch electrode is a touch driving electrode, and the other is a touch sensing electrode.

In some implementations, the touch layer 80 may be made of a metal material, which may reduce the resistance of the touch layer 80, thereby reducing signal attenuation on the touch layer 80. Certainly, the first touch units 811, the second touch units 812, and the connecting parts 813 may be made of a transparent metal oxide material such as indium tin oxide.

In some implementations, as shown in FIG. 2, each of the first touch units 811 and each of the second touch units 812 correspond to one auxiliary electrode 70, respectively, so that the number of the auxiliary electrodes 70 is as large as possible, and the resistance of the cathode of the light emitting unit 20 can be as small as possible. In addition, an area of the auxiliary electrode 70 may be appropriately increased to reduce the resistance of the auxiliary electrode 70.

In some implementations, as shown in FIG. 1, a protective layer 96 is arranged on a surface of the second touch pattern 82 distal from the second substrate 12 (i.e., a surface of the bridging part 821). The protective layer 96 is made of an insulating material, so as to protect the bridging parts 821, meanwhile, reduce parasitic capacitance between the bridging part 821 and the second electrode 22 and thus improve touch sensitivity.

Figure 4:
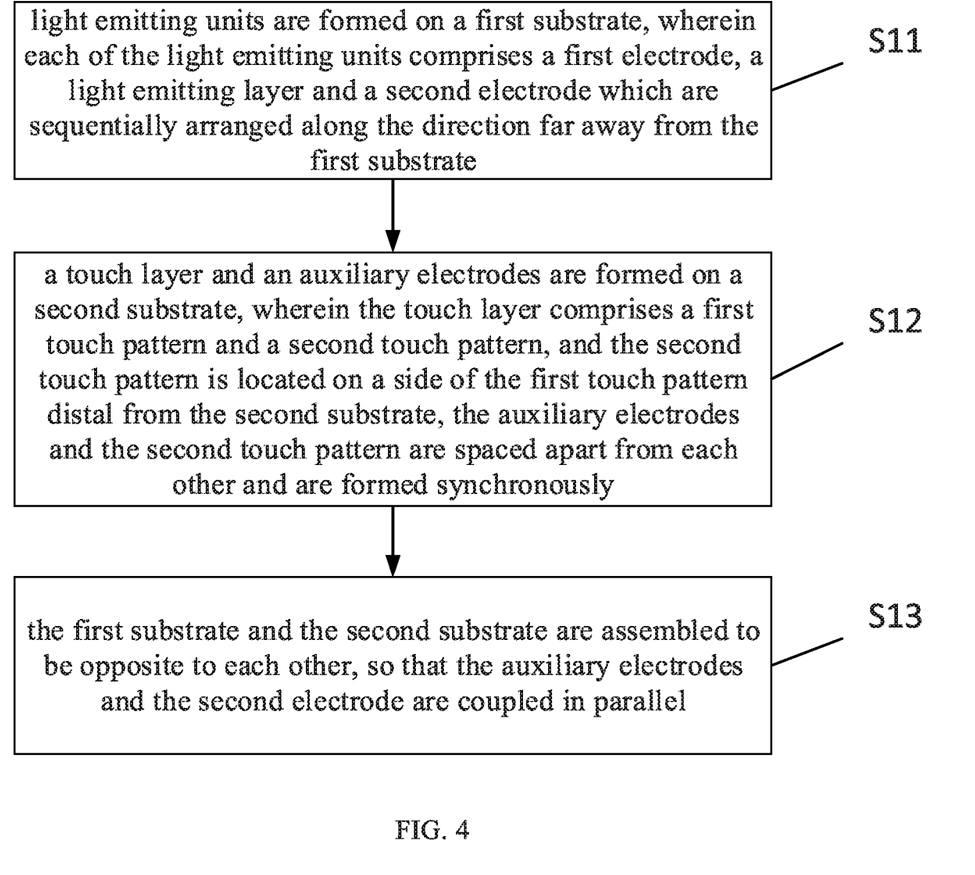
FIG. 4 is a flowchart of a manufacturing method of a touch display panel according to an embodiment of the present disclosure.

An embodiment of the present disclosure provides a manufacturing method of a touch display panel, and FIG. 4 is a flowchart of a manufacturing method of a touch display panel according to an embodiment of the present disclosure, as shown in FIG. 4, the manufacturing method includes following steps S11 to S13.

In step S11, light emitting units are formed on a first substrate, and each of the light emitting units includes a first electrode, a light emitting layer and a second electrode which are sequentially arranged along the direction far away from the first substrate.

In step S12, a touch layer and an auxiliary electrodes are formed on a second substrate, the touch layer includes a first touch pattern and a second touch pattern, and the second touch pattern is located on a side of the first touch pattern distal from the second substrate, the auxiliary electrodes are spaced apart from the second touch pattern and are formed synchronously with the second touch pattern.

In step S13, the first substrate and the second substrate are assembled to be opposite to each other, so that the auxiliary electrode and the second electrode are coupled in parallel.

The order of step S11 and step S12 is not particularly limited. In addition, in step S13, the first substrate and the second substrate may be directly bonded to each other, so that the auxiliary electrode and the second electrode are directly bonded to each other and coupled in parallel.

In an embodiment, the auxiliary electrodes and the second touch pattern are formed synchronously, so that the auxiliary electrodes do not need to be manufactured separately, and the manufacturing process is simplified. Moreover, the light emitting layer of the light emitting unit cannot be influenced in the manufacturing process of the auxiliary electrodes and the second touch pattern, and the product quality is ensured.

In some implementations, the first touch pattern includes a plurality of first touch unit sets, a plurality of second touch unit sets and a plurality of connecting parts, each of the first touch unit sets includes a plurality of first touch units arranged along a first direction, and each of the second touch unit sets includes a plurality of second touch units arranged along a second direction; any two adjacent first touch control units in a same first touch unit set are coupled to each other through a connecting part, and the first direction and the second direction intersect with each other. The second touch pattern includes a plurality of bridging parts, any two adjacent second touch control units in a same second touch control unit set are coupled to each other through a bridging part, and the bridging parts are insulated and separated from the connecting parts.

In some implementations, each of the first touch units and each of the second touch units correspond to one of the auxiliary electrodes, respectively.

In some implementations, the number of the light emitting units is plural, and the second electrodes of the plural light emitting units are formed as a whole. The first electrode is a reflective electrode, and the second electrode is a transparent electrode. After the first substrate and the second substrate are assembled to be opposite to each other, the auxiliary electrode is positioned on a surface of the second electrode distal from the first substrate.

Figure 5:
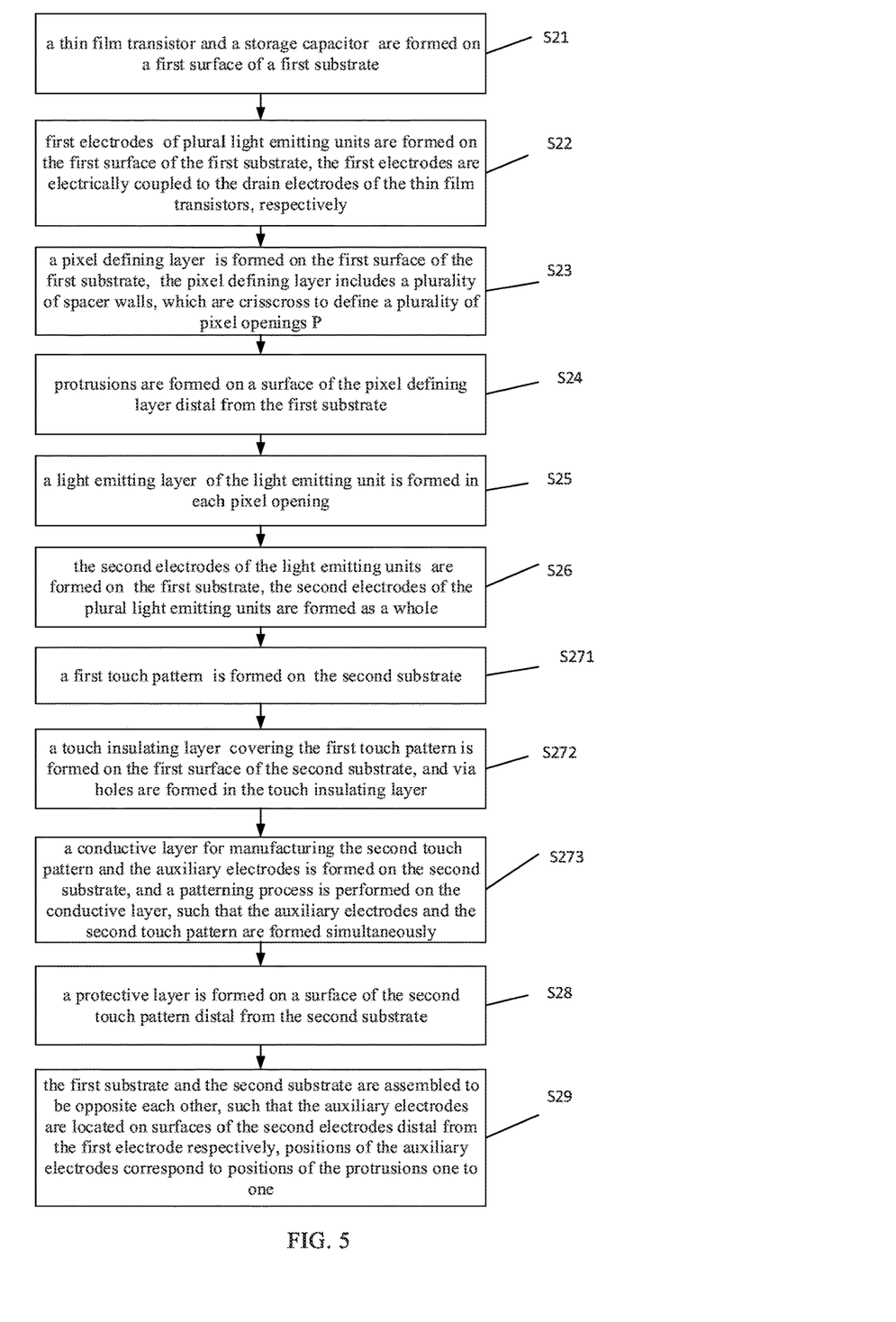
FIG. 5 is another flowchart of a manufacturing method of a touch display panel according to an embodiment of the present disclosure.

FIG. 5 is another flowchart of a manufacturing method of a touch display panel according to an embodiment of the present disclosure; FIGS. 6a to 6k are schematic views illustrating a manufacturing process of a touch display panel according to an embodiment of the present disclosure. The manufacturing method of a touch display panel is described in detail below with reference to FIGS. 5 to 6k, and the manufacturing method includes following steps S21 to S27.

Figure 6:
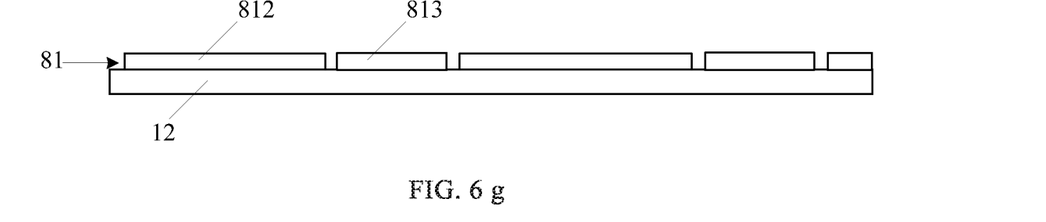
FIG. 6a to FIG. 6k are schematic views illustrating a manufacturing process of a touch display panel according to an embodiment of the present disclosure.
Figure 6A:
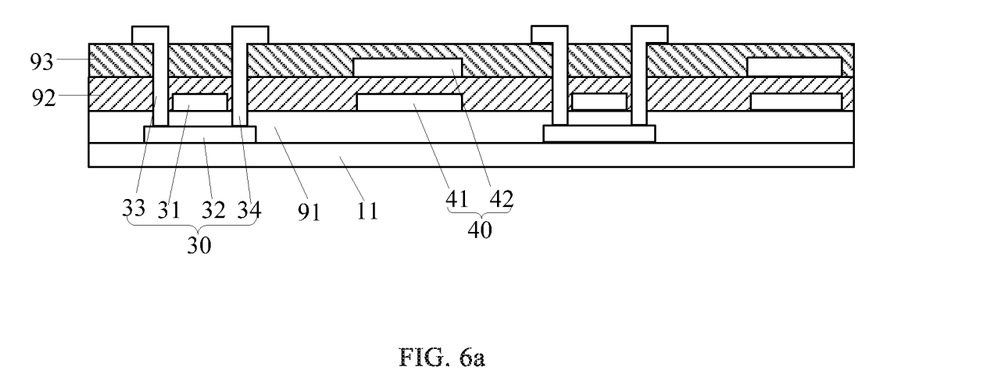

In step S21, a thin film transistor 30 and a storage capacitor 40 are formed on a first surface of a first substrate 11, as shown in FIG. 6a. The structures of the thin film transistor 30 and the storage capacitor 40 have been described above, and are not described here again.

Figure 6B:
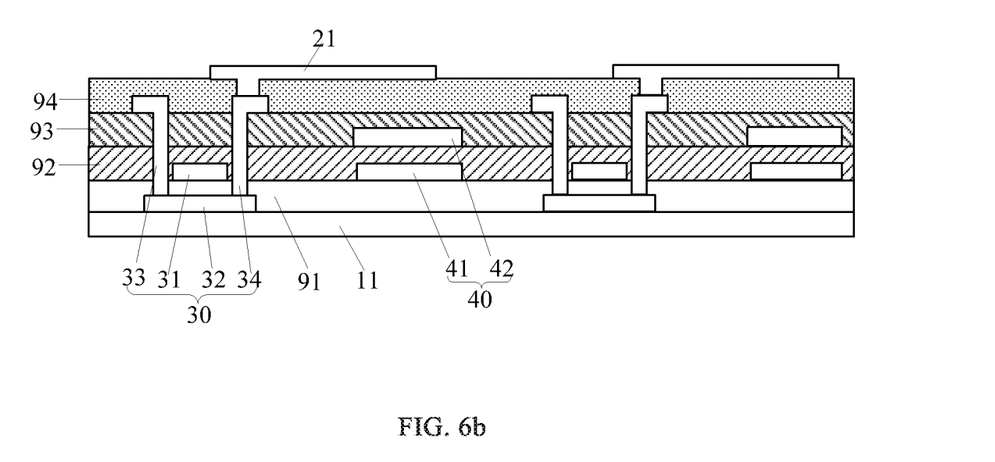

In step S22, first electrodes 21 of plural light emitting units are formed on the first surface of the first substrate 11, as shown in FIG. 6b, the first electrodes 21 are electrically coupled to the drain electrodes 34 of the thin film transistors 30, respectively.

Figure 6C:
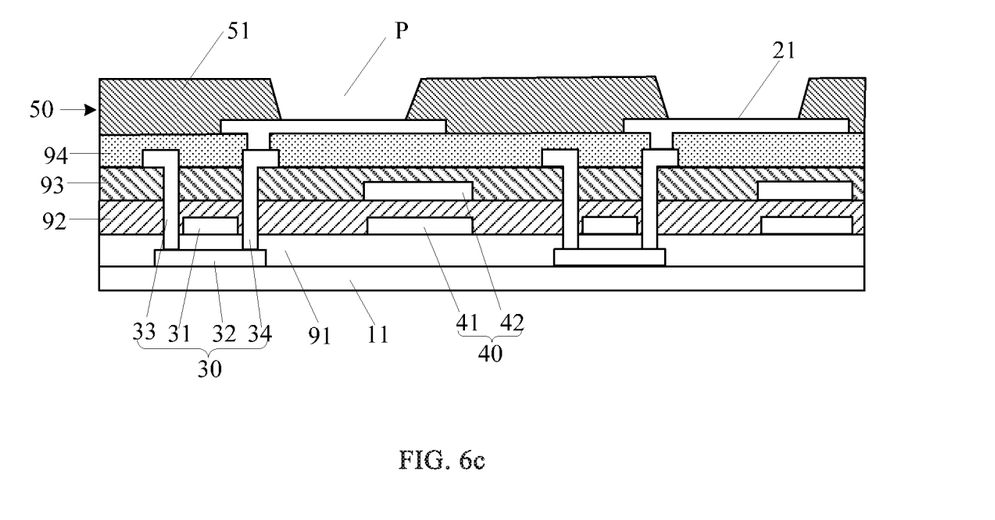

In step S23, a pixel defining layer 50 is formed on the first surface of the first substrate 11, as shown in FIG. 6c, the pixel defining layer 50 includes a plurality of spacer walls 51, which are crisscross to define a plurality of pixel openings P. The first electrodes 21 of the plural light emitting units 20 correspond to the plurality of pixel openings P one to one.

Figure 6D:
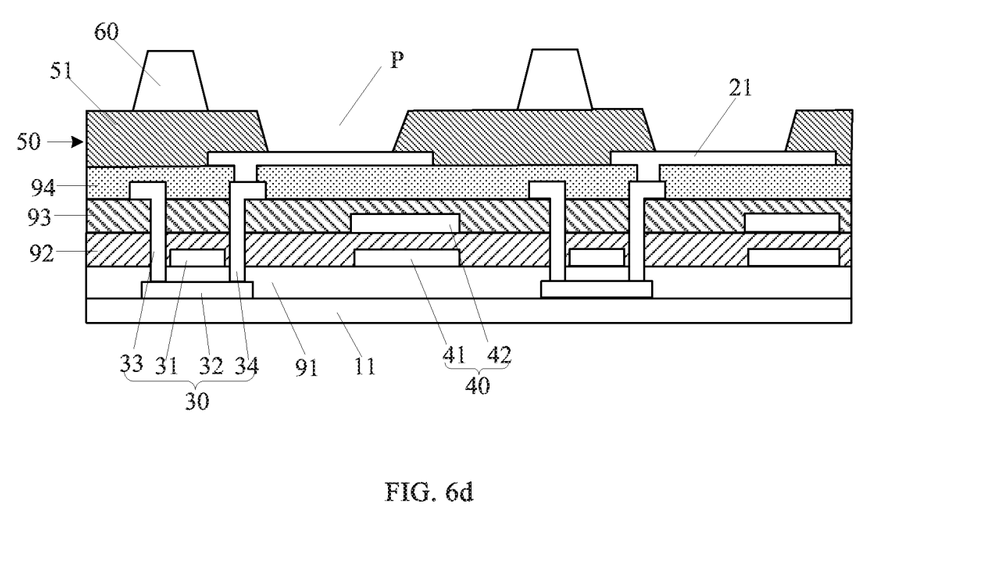

In step S24, protrusions 60 are formed on a surface of the pixel defining layer 50 distal from the first substrate, as shown in FIG. 6d.

Figure 6E:
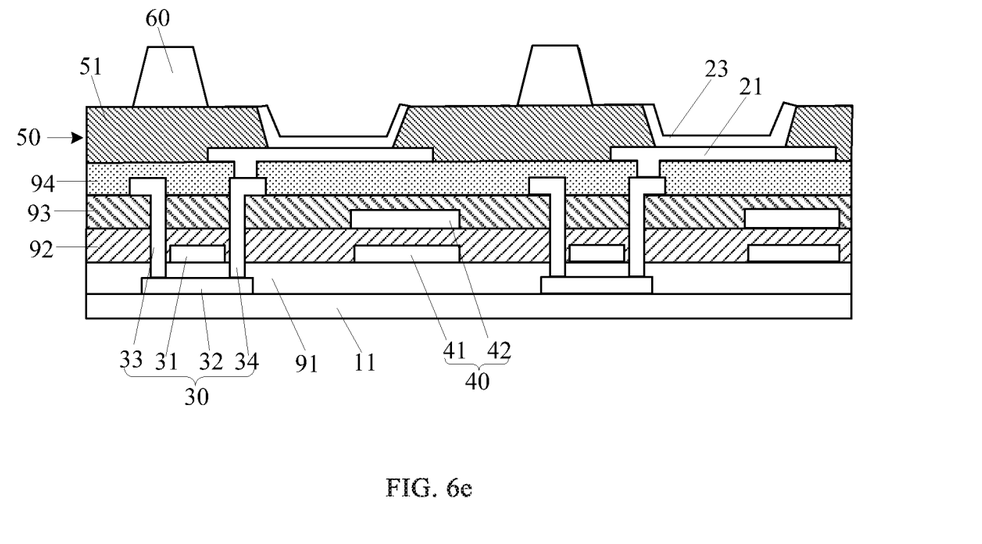

In step S25, a light emitting layer 23 of the light emitting unit is formed in each pixel opening, as shown in FIG. 6e.

Figure 6F:
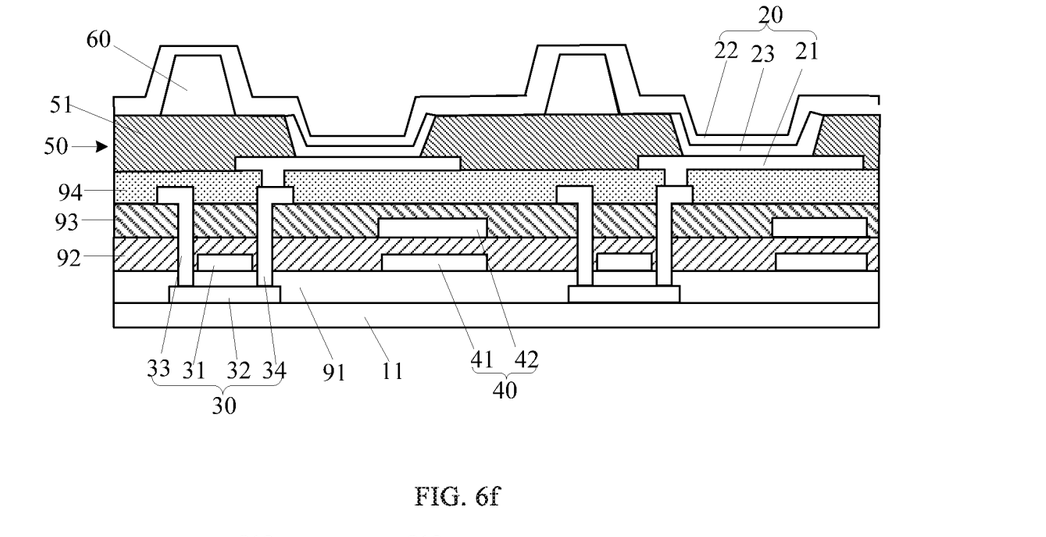

In step S26, the second electrodes 22 of the light emitting units 20 are formed on a surface of light emitting layer 23 distal from the first substrate, as shown in FIG. 6f. The second electrodes 22 of the plural light emitting units are formed as a whole. Each protrusion 60 is arranged between the spacer wall 51 and the second electrode 22.

In step S27, a touch layer and auxiliary electrodes are formed on a first surface of a second substrate 12. Specifically, the step S27 includes following steps S271 to S273.

In step S271, a first touch pattern 81 is formed on the first surface of the second substrate 12. As shown in FIGS. 6g and 2, the first touch pattern 81 includes a plurality of first touch unit sets, a plurality of second touch unit sets, and a plurality of connecting parts 813, each of the first touch unit sets includes a plurality of first touch units 811 arranged along a first direction, and each of the second touch unit sets includes a plurality of second touch units 812 arranged along a second direction, every two adjacent first touch units 811 in a same set are coupled to each other by a connecting portion 813. The cross sectional views of FIGS. 6g to 6j are taken along the line AA in FIG. 2.

Figure 6H:
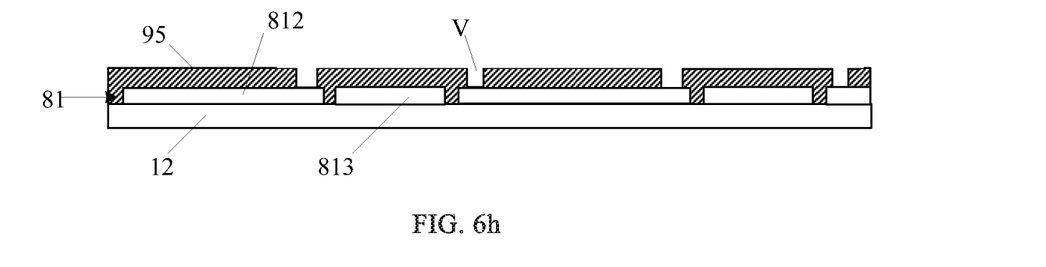

In step S272, a touch insulating layer 95 covering the first touch pattern 81 is formed on the first surface of the second substrate 12, and via holes V are formed in the touch insulating layer 95, as shown in FIG. 6h.

Figure 6I:
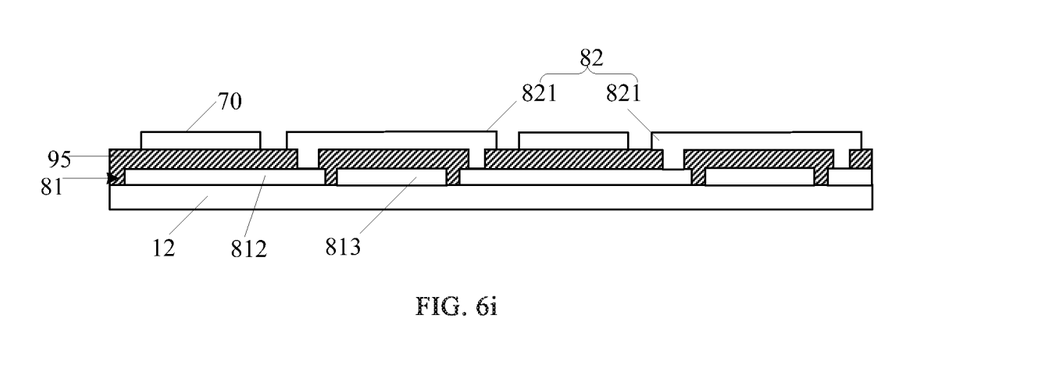

In step S273, a conductive layer (which may be a metal layer) for manufacturing the second touch pattern and the auxiliary electrodes is formed on the first surface of the second substrate 12, and a patterning process is performed on the conductive layer, such that the auxiliary electrodes 70 and the second touch pattern 82 are formed simultaneously. As shown in FIGS. 1, 2 and 6i, each of the first touch units 811 and each of the second touch units 812 correspond to one of the auxiliary electrodes 70 respectively. The second touch pattern 82 includes a plurality of bridging parts 821. Every two adjacent second touch units 812 in a same second touch unit set are coupled to each other through a bridging part 821, and the bridging part 821 couples the two adjacent second touch units 812 through the via holes in the touch insulating layer 95.

Figure 6J:
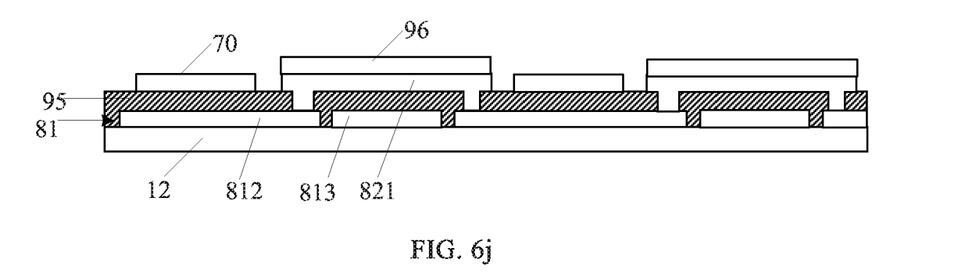

In step S28, a protective layer 96 is formed on a surface of the second touch pattern 82 distal from the second substrate 12, that is, the protective layer 96 is formed on a surface of each bridging part 821 distal from the second substrate 12, as shown in FIG. 6j.

Figure 6K:
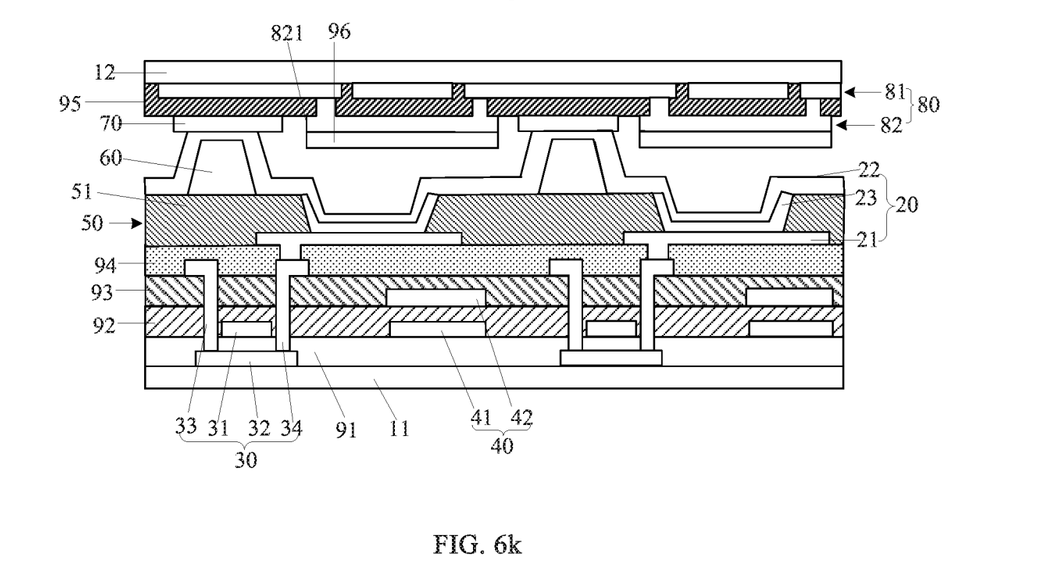

In step S29, as shown in FIG. 6k, the first substrate 11 and the second substrate 12 are assembled to be opposite to each other, that is, the first surface of the first substrate 11 and the first surface of the second substrate 12 are arranged opposite to each other, such that the auxiliary electrodes 70 are located on surfaces of the second electrodes 22 distal from the first electrodes 21 respectively, and positions of the auxiliary electrodes 70 correspond to positions of the protrusions 60 one to one.

An embodiment of the disclosure provides a display device including the touch display panel described above. The display device my be any product or component with touch control and display functions, such as a mobile phone, a tablet computer, a television, a display, a notebook computer, a digital photo frame, a navigator and the like.

As described above, the touch display panel and the manufacturing method thereof, and the display device provided by the present disclosure are described, and it can be seen that, in the touch display panel provided by the present disclosure, the auxiliary electrodes can be manufactured simultaneously with the second touch pattern, so that the manufacturing process is simplified and the resistance of the cathode of the light emitting unit is reduced. Also, protrusions are formed between the second electrodes and the first substrate, the auxiliary electrodes are formed above the protrusions, thereby ensuring parallel connection between the auxiliary electrodes and the second electrodes, and preventing short circuit between the touch layer and the second electrodes.

It should be understood that, the above embodiments are only exemplary embodiments for the purpose of explaining the principle of the present disclosure, and the present disclosure is not limited thereto. For one of ordinary skill in the art, various variants and modifications may be made without departing from the spirit and essence of the present disclosure. These variants and modifications also fall within the protection scope of the present disclosure.

The invention claimed is:

1. A touch display panel, comprising a first substrate and a second substrate arranged opposite to each other, wherein light emitting units are arranged on the first substrate, each of the light emitting units comprises a first electrode, a light emitting layer and a second electrode which are arranged in sequence along a direction away from the first substrate, a touch control layer is arranged on the second substrate and comprises a first touch pattern and a second touch pattern, the second touch pattern is located on a side of the first touch pattern distal from the second substrate, auxiliary electrodes are arranged on the second substrate, the auxiliary electrodes are spaced apart from the second touch pattern and arranged in a same layer as the second touch pattern, and the auxiliary electrodes are in electrical contact with the second electrodes, wherein the first touch pattern comprises a plurality of first touch unit sets, a plurality of second touch unit sets and a plurality of connecting parts, each of the first touch unit sets comprises a plurality of first touch units arranged along a first direction, and each of the second touch unit sets comprises a plurality of second touch units arranged along a second direction;

any two adjacent first touch units in a same first touch unit set are coupled to each other through a connecting part, and the first direction and the second direction intersect with each other;

the second touch pattern comprises a plurality of bridging parts, any two adjacent second touch units in a same second touch unit set are coupled to each other through a bridging part, and the bridging parts are insulated and separated from the connecting parts, each of the first touch units and each of the second touch units correspond to one of the auxiliary electrodes, respectively; and a protective layer is arranged on a surface of the second touch pattern distal from the second substrate, and the protective layer is not in contact with the second electrode.

2. The touch display panel of claim 1, wherein a pixel defining layer is further arranged on the first substrate, the pixel defining layer comprising a plurality of spacer walls, which are crisscross to define a plurality of pixel openings, first electrodes of the light emitting units correspond to the pixel openings one to one, and second electrodes of the light emitting units are formed as a whole;

a protrusion is arranged on each spacer wall and is arranged between the spacer wall and the second electrode; positions of the auxiliary electrodes correspond to positions of protrusions one to one.

3. The touch display panel of claim 1, wherein the first electrode is a reflective electrode and the second electrode is a transparent electrode.

4. The touch display panel of claim 3, wherein the first electrode is a metal electrode.

5. The touch display panel of claim 3, wherein the second electrode is a composite electrode of ITO/metal/ITO.

6. A manufacturing method of a touch display panel, comprising:

forming light emitting units on a first surface of a first substrate, wherein each of the light emitting units comprises a first electrode, a light emitting layer and a second electrode sequentially arranged in a direction away from the first surface of the first substrate;

forming a touch layer and auxiliary electrodes on a first surface of a second substrate, wherein the touch layer comprises a first touch pattern and a second touch pattern, and the second touch pattern and the auxiliary electrodes are located on a side of the first touch pattern distal from the second substrate, the auxiliary electrodes are spaced apart from the second touch pattern and are formed synchronously with the second touch pattern;

assembling the first substrate and the second substrate so that the first substrate and the second substrate are opposite to each other, the auxiliary electrodes are in electrical contact with the second electrodes, wherein the first touch pattern comprises a plurality of first touch unit sets, a plurality of second touch unit sets and a plurality of connecting parts, each of the first touch unit sets comprises a plurality of first touch units arranged along a first direction, and each of the second touch unit sets comprises a plurality of second touch units arranged along a second direction; any two adjacent first touch units in a same first touch unit set are coupled to each other through a connecting part, and the first direction and the second direction intersect with each other;

the second touch pattern comprises a plurality of bridging parts, any two adjacent second touch units in a same second touch unit set are coupled to each other through a bridging part, and the bridging parts are insulated and separated from the connecting parts, each of the first touch units and each of the second touch units correspond to one of the auxiliary electrodes, respectively; and a protective layer is arranged on a surface of the second touch pattern distal from the second substrate, and the protective layer is not in contact with the second electrode.

7. The manufacturing method of claim 6, further comprising:

forming a pixel defining layer on the first surface of the first substrate, the pixel defining layer comprising a plurality of spacer walls which are crisscross to define a plurality of pixel openings, first electrodes of the light emitting units correspond to the pixel openings one to one, and second electrodes of the light emitting units are formed as a whole; and forming protrusions on a surface of the pixel defining layer distal from the first substrate, the protrusions being arranged between the spacer walls and the second electrodes; and after the first substrate and the second substrate are assembled to be opposite to each other, positions of the auxiliary electrodes correspond to positions of protrusions one to one.

8. The manufacturing method of claim 6, further comprising:

before the first substrate and the second substrate are assembled to be opposite to each other, forming a protective layer on a surface of the second touch pattern distal from the second substrate.

9. The manufacturing method of claim 6, wherein the first electrode is formed as a reflective electrode and the second electrode is formed as a transparent electrode.

10. A display device, comprising the touch display panel of claim 1.

11. A display device, comprising the touch display panel of claim 2.

12. A display device, comprising the touch display panel of claim 3.

13. A display device, comprising the touch display panel of claim 4.

14. A display device, comprising the touch display panel of claim 5.

* * * * *